(12) United States Patent
Rius

(10) Patent No.: US 6,328,805 B1
(45) Date of Patent: Dec. 11, 2001

(54) EQUIPMENT FOR PROCESSING A CONTAINER USING A LOW-PRESSURE PLASMA HAVING AN IMPROVED VACUUM CIRCUIT

(75) Inventor: Jean-Michel Rius, Le Havre (FR)

(73) Assignee: Sidel, Le Havre (FR)

( * ) Notice: Subject to any disclaimer, the term of this patent is extended or adjusted under 35 U.S.C. 154(b) by 0 days.

(21) Appl. No.: 09/558,341

(22) Filed: Apr. 26, 2000

(30) Foreign Application Priority Data

Oct. 25, 1999 (FR) .................................................. 99 13638

(51) Int. Cl.$^7$ .............................. C23C 16/00; H05H 1/00; B05D 3/00
(52) U.S. Cl. ...................... 118/715; 118/733; 118/723 E; 156/345; 427/491
(58) Field of Search ........................... 118/715, 723 MW, 118/723 R, 733, 719; 156/345; 427/491

(56) References Cited

U.S. PATENT DOCUMENTS

| 5,677,010 | 10/1997 | Esser et al. . |
| 5,798,139 | * 8/1998 | Negashima et al. .................. 427/237 |
| 5,849,366 | * 12/1998 | Plester et al. .......................... 427/491 |
| 6,037,562 | * 3/2000 | Awakowicz et al. ............ 219/121.59 |
| 6,112,695 | * 9/2000 | Felts ................................. 118/723 E |

FOREIGN PATENT DOCUMENTS

| 3632748 A1 | 4/1988 | (DE) . |
| 43 16 349 C2 | 11/1994 | (DE) . |
| 198 02 333 A1 | 7/1999 | (DE) . |
| WO 95/22413 | 8/1995 | (EP) . |
| WO 97/44503 | 11/1997 | (EP) . |
| WO 99/17334 | 4/1999 | (EP) . |
| 2 776 540 | 10/1999 | (FR) . |
| 2776540-A1 | * 10/1999 | (FR) ................................ B05D/7/24 |

OTHER PUBLICATIONS

Abstract for Patent No. DE 198 02 333 A1.

Abstract for Patent No. DE 43 16 349 C2.

Abstract for Patent No. DE 3632748 A1.

* cited by examiner

Primary Examiner—Gregory Mills
Assistant Examiner—P. Hassanzadeh
(74) Attorney, Agent, or Firm—Sughrue Mion, PLLC

(57) ABSTRACT

Device for processing a container (30) using a low pressure plasma, of the type having at least one processing station (14) comprising a fixed cavity (32) connected to a vacuum source by way of a vacuum circuit (74) and of the type in which processing station (14) has a mobile cover (34) equipped with means (54) for supporting container (30) such that the introduction of the container into cavity (32) is assured by displacement of cover (34) with respect to cavity (32), characterized in that cover (34) has a connecting channel (64) which, when cover (34) is in closed position sealing cavity (32) places cavity (32) in connection with a fixed end (68) of vacuum circuit (74).

6 Claims, 5 Drawing Sheets

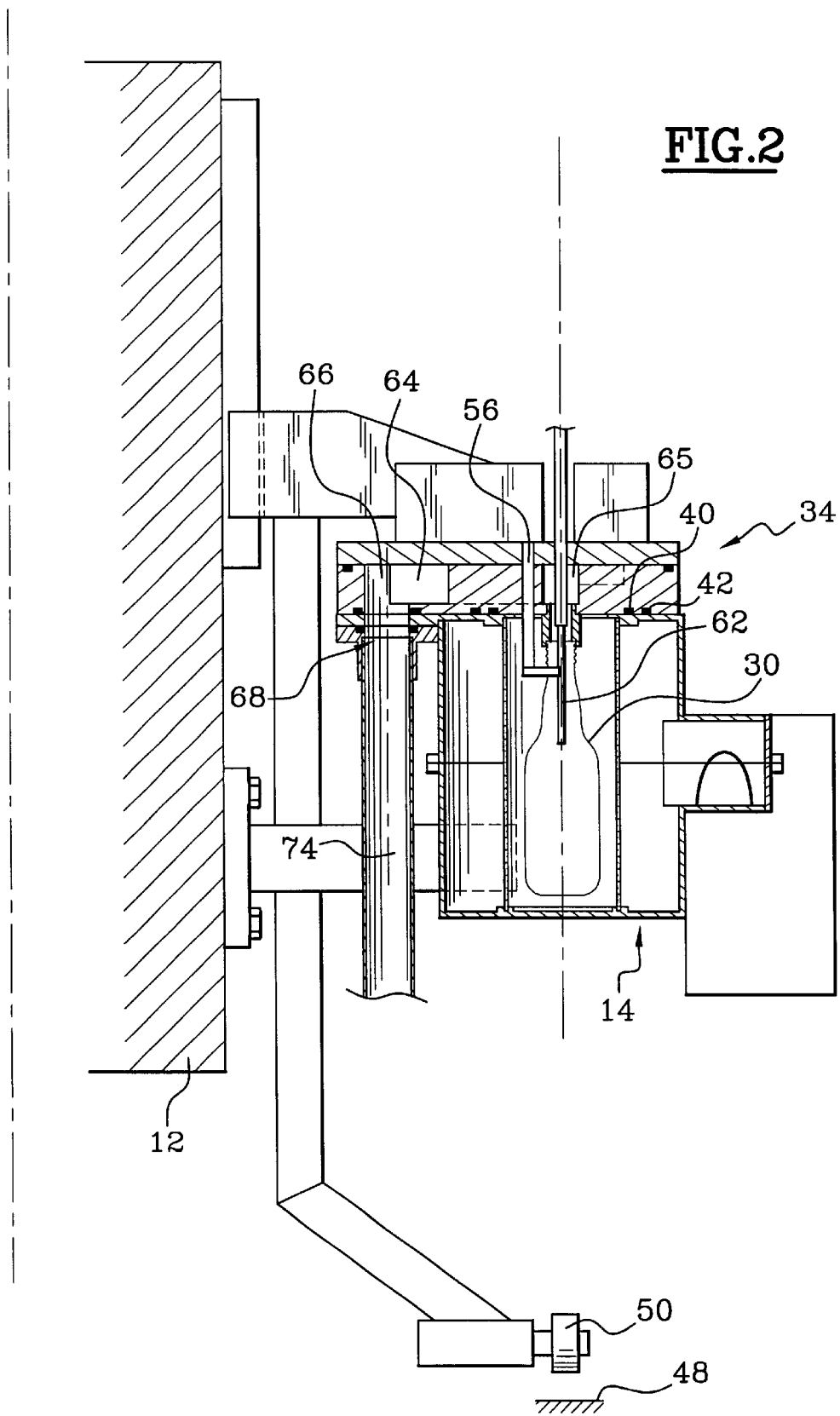

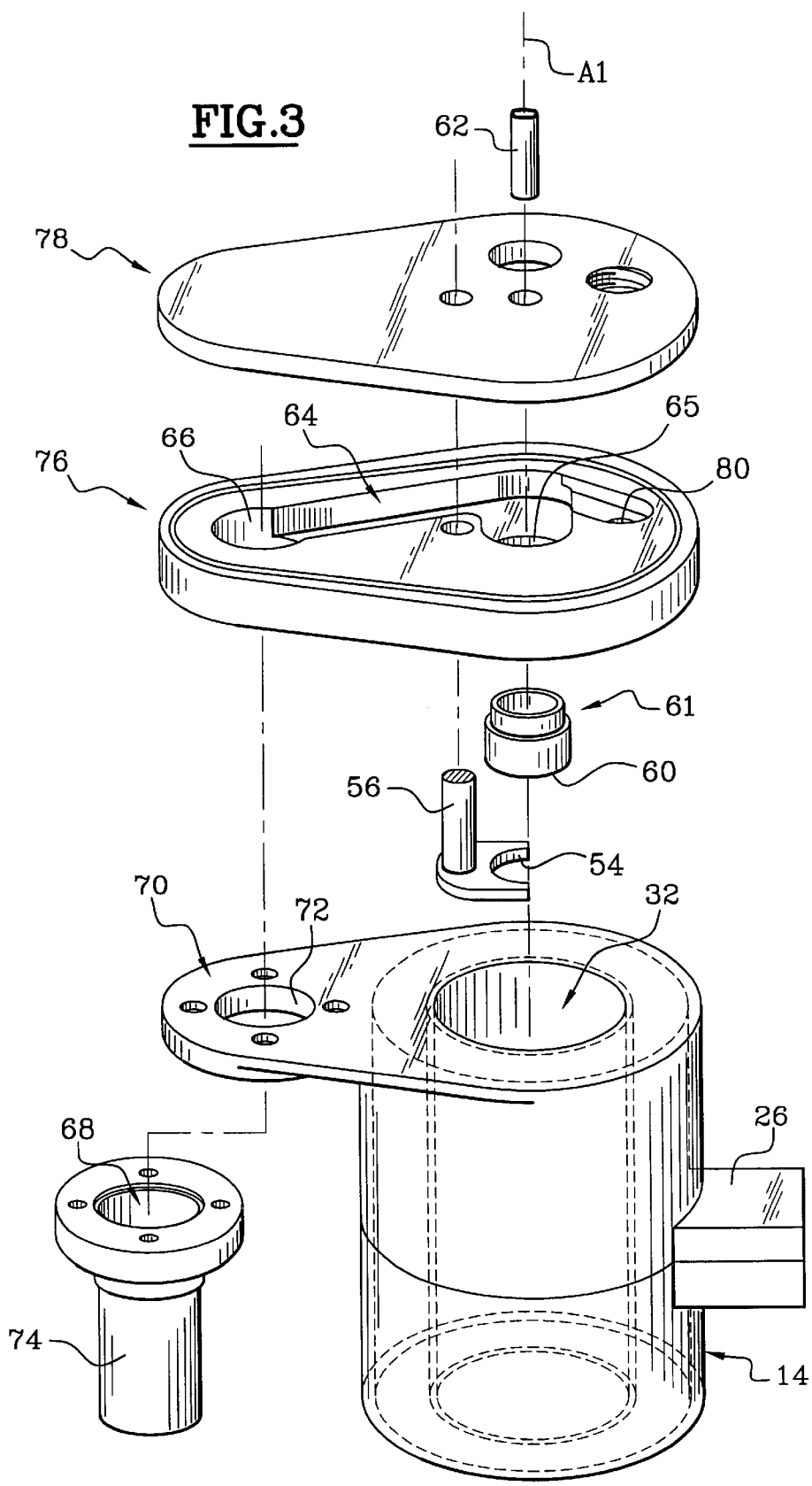

EQUIPMENT FOR PROCESSING A CONTAINER USING A LOW-PRESSURE PLASMA HAVING AN IMPROVED VACUUM CIRCUIT

The invention involves the area of equipment for processing a container using a low-pressure plasma in which the plasma is created by excitation of a gas using electromagnetic waves.

Equipment of this type is described, for example, in patent application WO99/49991 from the same applicant, to which reference can be made for any clarification regarding the processes that can be used with the device according to the invention. In the equipment described in the document mentioned above, it is provided that each container is held in a processing station having a sealed cavity and an external enclosure. The station is provided with an upper mobile cover which makes it possible to open the cavity in order to insert a container to be processed into it. In the closed position, the cover closes this cavity in a sealed manner in order to obtain the low pressure necessary for creating a plasma called cold plasma in the cavity. Advantageously, the cover of the device has means for supporting the container in such a way that the introduction and removal of the container would be assured by movement of the cover between its opening and closing positions.

The device described in the document WO99/49991 is a device in which the goal of processing with low-pressure plasma is to deposit a material on the container walls. For this, it is necessary to bring into the processing cavity a precursor gas which is ionized to plasma form. Advantageously, the said document thus provides that the means of injecting the precursor gas has an injector mounted on the cavity cover.

In addition, in order to achieve the low pressure necessary to establish a plasma, the cavity must be connected to pumping means for a circuit called a vacuum circuit. Here again the document mentioned above provides that the end of this vacuum circuit is placed on the cover to open directly into the cavity.

However, this document does not describe in a specific manner the means that make it possible to connect the cover to the vacuum circuit.

Thus the goal of the invention is to propose a specific design of the vacuum circuit which makes perfectly reliable functioning possible of the machine that incorporates this device.

With this goal, the invention proposes a device for processing of the type described above characterized in that the cover has a connecting tube which, when the cover is in its sealed, closed position on the cavity, causes a communication of the cavity with one fixed end of the vacuum circuit.

According to other characteristics of the invention:
the connecting tube has a joining end, which works together with the fixed end of the vacuum circuit, and two ends which open into the inside of the cover which delimits the cavity when the cover is in the closed position, and support means are provided that place, in a sealed manner, an opening of the container to be processed against the said inside face of the cover. The opening completely surrounds a first of the said ends in such a way that the container delimits, in the cavity, a first part connected to the vacuum circuit by the first end and the second part connected to the vacuum circuit by the second of the said ends;
one of the two ends has a controlled shutter in order to be able to separate the two parts of the cavity in a sealed manner when the cover is in the closed position;
the shutter is a controlled valve;
the first end of the connecting tube permits passage of an injector to bring a reagent gas to the inside of the container; and
the connecting tube has a recovery opening for air, which opens out into the open air and which is equipped with a sealing flap in order to be able to connect the cavity to the outside atmosphere at the end of processing.

Other characteristics and advantages of the invention will be evident from a reading of the detailed description which follows as well as in the attached drawings in which:

FIG. 2 is a view similar to that in FIG. 1 in which the cover is illustrated with the cavity closed;

FIG. 3 is a schematic diagram in exploded perspective view of the different components of a processing station according to the invention;

Figure 1:
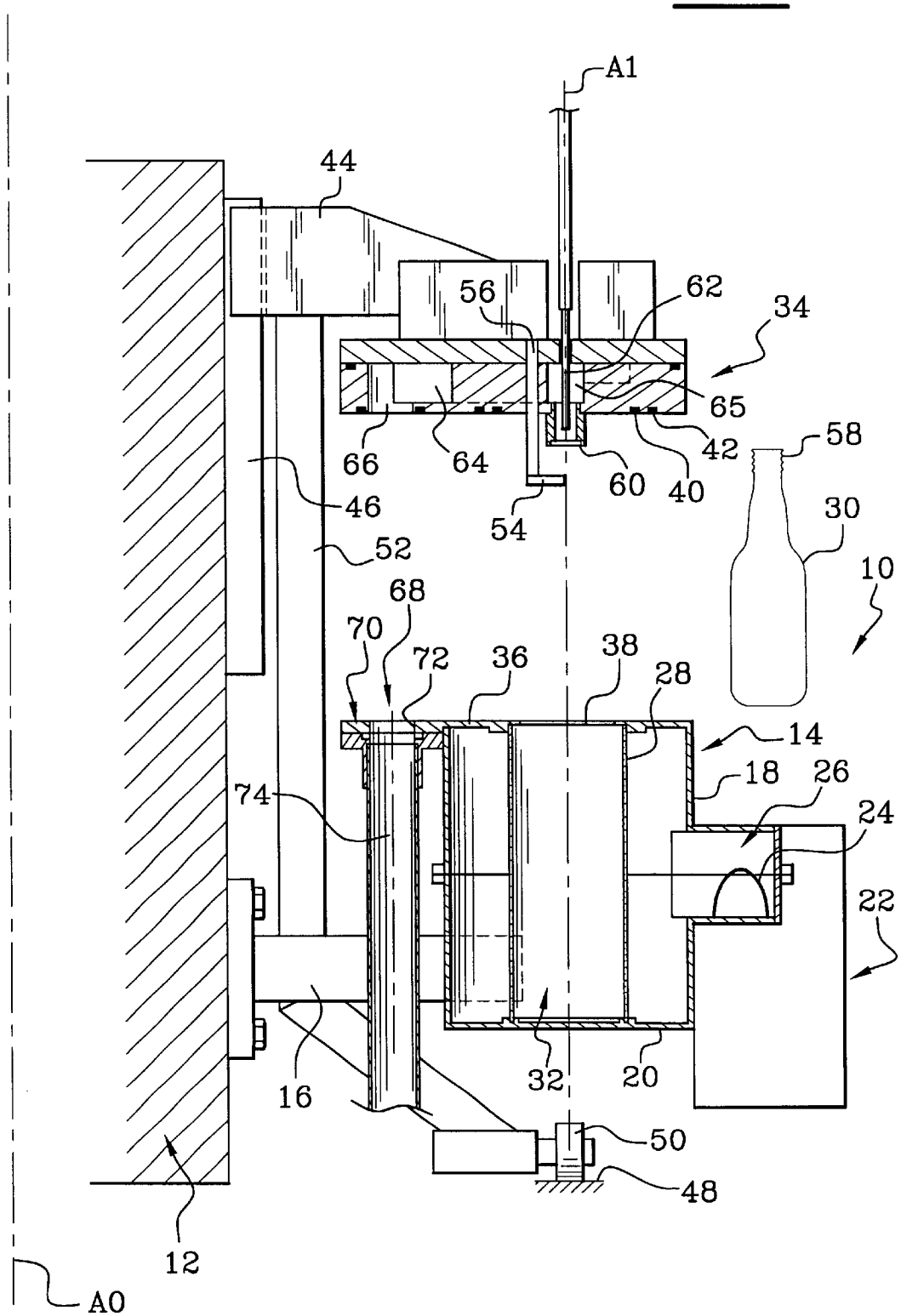
FIG. 1 is a schematic diagram in axial cross section of a machine incorporating a processing device according to the invention of which the cover is illustrated in open position.

FIGS. 1 and 2 show schematic views in axial cross section of a processing station 10 according to the instructions in the invention. Here station 10 is part of a rotary machine having a carousel 12 that is in continuous rotation movement around a vertical axis A0. The carousel 12 is thus provided to carry, on its periphery, a series of processing stations 10 identical to the one illustrated. The stations are distributed in a regular manner around axis A0.

The processing station 10 has an external enclosure 14 which is fastened by a radial support 16 to the periphery of carousel 12. The enclosure 14 is made of electrically conductive material, for example of metal, and it is formed of a tubular cylindrical wall 18 with vertical axis A1. The enclosure is closed at its lower end by a lower base wall 20.

On the outside of enclosure 14, fastened to same, there is a housing 22 which has the ability (not shown) to create an electromagnetic field on the interior of enclosure 14. When this occurs, it may be a case of means that are able to generate an electromagnetic wave in the UHF range, i.e. in the microwave range. In this case, housing 22 can thus hold a magnetron of which antenna 24 extends into a wave guide 26. This wave guide 26 is, for example, a tunnel with rectangular cross section which extends along a radius in comparison to axis A0 and which opens directly into the interior of enclosure 14 through lateral wall 18. Still, the invention may also be used in the scope of a device equipped with a source of radiation of the radiofrequency type and/or the source could also be attached differently, for example at the lower axial end of enclosure 14.

On the interior of enclosure 14, a tube 28 with axis A1 is found which is made of a transparent material for the electromagnetic waves introduced into enclosure 14 by way of wave guide 26. For example, this tube 28 could be made of quartz. This tube 28 is intended to hold a container 30 to be processed. Thus its interior diameter must be adapted to the diameter of the container. In addition, it must delimit a cavity 32 in which a vacuum on the order of $10^{-4}$ bar can be created once the container is on the inside of the enclosure.

As can be seen in FIG. 1, enclosure 14 is partially closed at its upper end by an upper wall 36 which is provided with a central opening 38 that has a diameter that is essentially equal to the diameter of tube 28 in such a way that tube 28 will be totally open toward the top in order to permit the introduction of container 30 into cavity 32. On the other hand, it can be seen that lower metallic wall 20, to which the lower end of tube 28 is connected in a sealed manner, forms the base of cavity 32.

In order to re-close enclosure 14 and cavity 32, processing station 10 thus has a cover 34 which can be moved axially between a top position shown in FIG. 1 and a bottom closing position shown in FIG. 2. In top position, the cover is sufficiently disconnected to permit the introduction of container 30 into cavity 32.

In closed position, shown in FIG. 2, cover 34 comes to rest in a sealed manner against the upper edge of upper wall 36 of enclosure 14. As the upper end of tube 28 is connected in a sealed manner to upper wall 36, cover 34 at the same time is able to close the cavity 32 in a sealed manner. A seal 40 of the toric seal type is provided for this which is held by the cover 34 and which comes to rest on the upper wall 36 of the cavity 14 around central opening 38.

In addition, cover 34 also has a flexible conductor ring 42, for example, made in the form of a metallic braid, which also comes to rest against wall 36 in order to assure an electrical connection between enclosure 14 and cover 34 when the latter is in the closed position. In fact, the cover is made up of a conductive material and it also has the function of closing enclosure 14 in order to permit the establishment, on the interior of same, of an electromagnetic field that is able to create a plasma in cavity 32. In an advantageous manner, this conductor ring may be made on the basis of a flexible material (of the silicone type) loaded with metallic particles in order to be electrically conductive. In fact, a conductor ring of this type may play the role of a sealing joint and at the same time that of an electrical connection between the cover and enclosure 14.

In the example illustrated, cover 34 glides vertically with respect to enclosure 14. For this purpose, it is carried by a sled 44 which glides on a slide 46 which is a part of carousel 12. However, it is possible to imagine cover 34 with another movement with respect to cavity 14 between its opening and closing positions, for example a pivoting movement around a horizontal axis.

In the example shown, it is advantageous that the processing station would be mounted on a rotary carousel to control the movements of the cover using a cam 48 and roller 50 system. In fact, the machine has a fixed cam 48 which extends in a circular arch around axis A0 and of which one upper edge forms a roller track. Naturally, the height of cam 48 varies as a function of the angular position around axis A0.

The roller 50 is connected to sled 44, which holds cover 34 by a post 52, and it thus has the same rotation as carousel 12. When roller 50 arrives at an angular section where cam 48 raises, the roller thus causes the cover to raise towards its upper position. On the other hand, in the other angular sections, the level of the cam lowers and roller 50 then permits cover 34 to go back down towards its closed position. Naturally, other means for controlling the movement of cover 34 can be imagined without leaving the scope of the invention.

In a particularly advantageous manner, cover 34 does not have only the sole function of assuring the sealed closure of cavity 32. In fact, it has complementary elements.

First cover 34 has means for supporting the container. In the example shown, the containers to be processed are bottles of thermoplastic material, for example of polyethylene terephthalate (PET). These bottles have a flange with a radial protuberance at the bottom of their collar 58 in such a way that it is possible to grip them using a fork 54 which engages or locks around the collar below the flange. This fork 54 is thus mounted on the lower end of a rod 56 that goes through cover 34. This rod 56 can be moved vertically with respect to the cover in such a way that bottle 30 may be held on the fork while being slightly off center at the base with respect to the cover (FIG. 1). Once held by fork 54, bottle 30 may be moved upward against a support surface 60 of cover 34. Preferably, this support is sealed in such a way that, when the cover is in the closed position, the interior space of cavity 32 is separated by the container wall into two parts: the inside and the outside of the container.

This device makes it possible to process only one of the two surfaces (interior or exterior) of the container wall. In the example shown, the goal is to treat only the internal surface of the container wall.

This internal processing thus makes it possible to simultaneously control the pressure and the composition of the gas present on the interior of the container. For this reason, the interior of the container must be able to be placed in communication with a vacuum source and with a circuit for gas distribution. The cover 34 thus has an injector 62 which is connected along axis A1 and which is also movable with respect to cover 34 between a top position for which container 30 may be brought radially onto fork 54 (FIG. 1) and a bottom position in which injector 62 is plunged into the interior of container 30 (FIG. 2).

Since the gas injected by injector 62 must be ionized and form a plasma due to the effect of the electromagnetic field created in the enclosure, it is necessary for the pressure in the container to be on the order of $10^{-4}$ bar. In order to make the interior of the container communicate with a vacuum source (for example, a pump), cover 34 has an internal tube 64 of which one main end 65 opens into the inside face of the cover, more specifically in the center of the support surface 60 against which the neck of bottle 30 is placed.

It can be noted that in the embodiment proposed, the support surface 60 is not formed directly on the inside face of the cover but on the lower annular end of a tubular part 61 with axis A1 which is fastened under cover 34. The internal bore of this tubular part 61, in this case, makes up the extension of the main end 65. Thus, when the upper end of the container collar is resting against support surface 60, the opening of container 30, which is delimited by this upper end, completely surrounds the hole by which the main end 65 opens into the lower face of cover 34.

According to the invention, this main end 65 is not connected directly to the pumping means. In fact, because of the mobility of cover 34, it would then be necessary to plan flexible tubes between the cover and the pumping circuit. Still, such tubes are not well adapted in a vacuum circuit since flexible tubing would have a tendency to collapse under the effect of atmospheric pressure.

Also, according to the invention, the internal tube 64 of cover 24 has one joining end 66 and the vacuum circuit of the machine has a fixed end 68 which is placed in such a way that the two ends 66, 68 would be facing each other when the cover is in the closed position.

In the example shown, the upper wall 36 of enclosure 14 has an extension 70 which extends in the same horizontal plane, toward the interior radially with respect to axis A0. This extension 70 is pierced by an opening 72, and it has means to make it possible to connect a tube 74 of the vacuum circuit. This tube 74 is, for example, connected to one or more pumps (not shown). These pumps are preferably attached to the outside of the machine and, in this case, they are connected to tube 74 by means of a turning joint (not shown) in such a way as not to obstruct the rotation of the carousel.

In this way, given that enclosure 14 is fixed with respect to carousel 12, tube 74 may be rigid or very slightly flexible.

As can be seen in FIG. 3, from above, cover 34 presents the same shape as that of the upper wall of enclosure 14 and the end of connector ring 66 thus opens into the lower edge of cover 34, fitting perpendicular to opening 72 where tube 74 is connected.

In order to simplify implementation of internal tube 64, cover 34 is made in two parts: a lower base 76 and an upper cap 78. Internal tube 64 is hollowed out in the upper edge of base 76, only the end of connector ring 66 and the main end 65 opening into the interior edge. Thus, when cap 78 is placed in a sealed manner on the seal, no more communication is possible except between the end of connector ring 66 and the end, while tube 64 assures a sealed connection between tube 74 and cavity 32.

The machine shown in these figures is provided for processing the internal surface of the containers which are of a relatively deformable material. Such containers cannot support an excess pressure on the order of 1 bar between the exterior and the interior of the bottle. Thus, in order to obtain a pressure on the order of $10^{-4}$ bar on the interior of the bottle without deforming the bottle, it is necessary that a part of the cavity 32 on the outside of the bottle would be at least partially depressurized. Thus, the internal tube 64 of cover 34 has, in addition to the main end 65, an auxiliary end 80 which also opens through the lower edge of the cover, but radially on the exterior of the annular surface 60 on which the collar of container 58 is placed.

Thus, the same pumping means simultaneously create the vacuum on the interior and on the exterior of the container.

In order to limit the pumping volume and to avoid the appearance of a non-usable plasma on the outside of the bottle, it is preferable that the pressure on the exterior does not drop below from 0.05 to 0.1 bar, compared to a pressure of $10^{-4}$ bar on the interior. In addition, it has been confirmed that the bottles, even with thin walls, can support this difference in pressure without being subject to a noticeable deformation. For this reason, providing the cover with a control valve 82 is planned, which is able to close auxiliary end 80.

Figure 5:
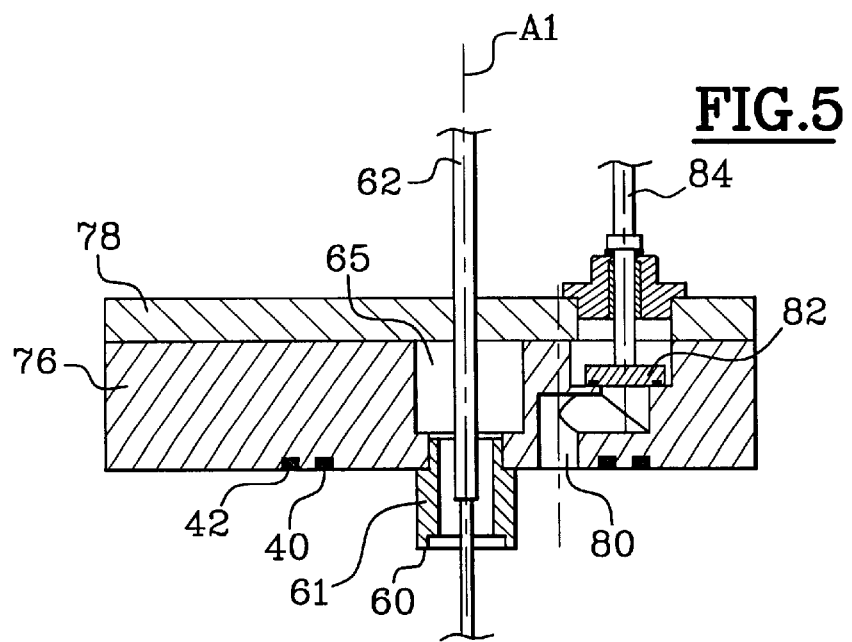
FIG. 5 is a schematic view in cross section along line 5—5 of FIG. 4 showing the two ends of the connecting tube.
Figure 4:
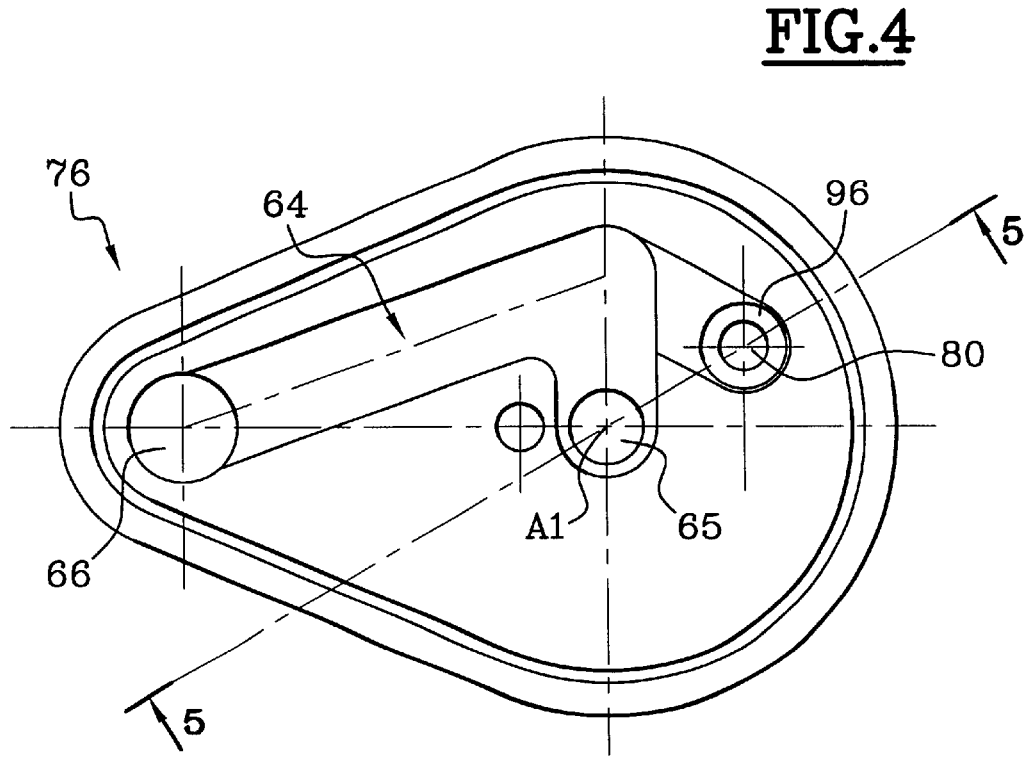
FIG. 4 is a schematic view of the cover according to the invention.

As can be seen in FIGS. 4 and 5, valve 82 is captured within cover 34, between base 76 and cap 78, and it is of the "normally closed" type. The valve 82 is connected to the lower end of a valve stem 84 which moves upward through cap 78 of cover 34.

Figure 6:
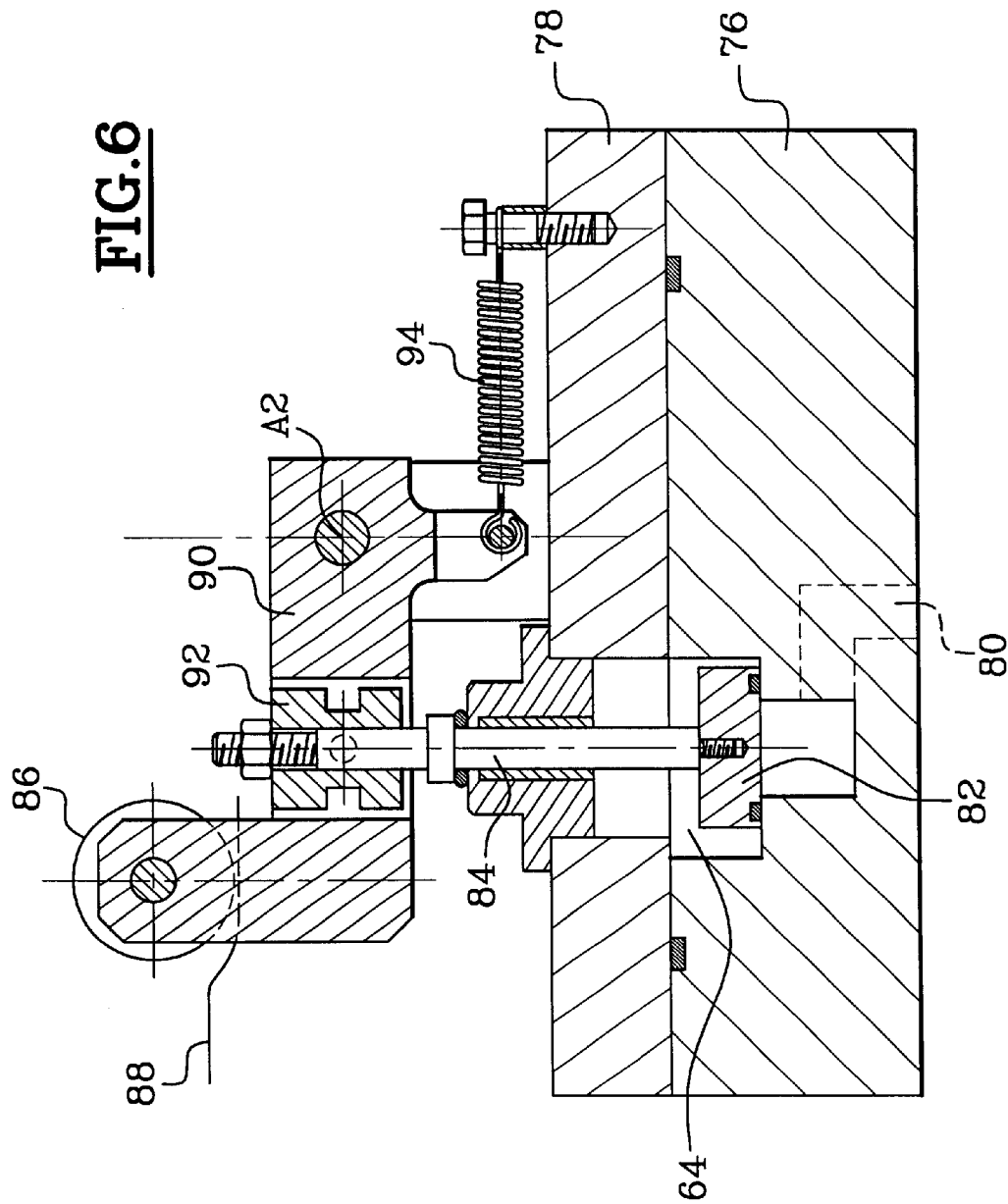
FIG. 6 is a schematic view in cross section showing the means of control for the valve that controls differential pressure between the inside and the outside of the container.

As can be seen in more detail in FIG. 6, valve stem 84 is controlled by a roller system 86 which is intended to work together with a cam 88 fastened to the machine. At a given point of the carousel rotation, cam 88 causes roller 86, which is connected to a lever 90 that is articulated around a horizontal axis A2 on cover 34, to raise. The roller thus causes a pivoting of lever 90, which causes a raising of stem 84 by means of control nut 92. When cam 88 permits the roller to go back down, a return spring 94, which acts between cover 34 and lever 90, tends to bring valve stem 84 back down to place valve 82 against a valve seat 96 formed around auxiliary end 80.

Naturally, other control means for valve 82 could be provided without leaving the scope of the invention. An actuator or solenoid could also be used, for example.

The function of the device which has just been described could thus be as follows:

At a given point in the carousel rotation, cover 34 is in the upper position. The fork 54 is in the lower position, and the injector is in the upper extended position such as is shown in FIG. 1. A container 30 may then be moved to this point on fork 54, for example using a notched transfer wheel. Wheels of this sort are largely known and used in manufacturing and filling machines for PET bottles. This wheel will thus be tangent to the carousel at the point for bottle loading.

Once the container is loaded on fork 54, carousel 12 follows its rotational movement and the cover lowers towards its closed position. At the same time, rod 56 which holds fork 54 is activated to place the container in a sealed manner against the support surface 58 of cover 34 and injector 62 is lowered to plunge into the interior of the container. It can thus be noted that the injector lowers through main end 65 of tube 64 but does not close it.

Once the cover is in the closed position, it is possible to aspirate the air contained in cavity 32 which is connected to the vacuum circuit because of the internal tube 64 of cover 34.

In a first step, valve 82 is actuated so that it is open while the pressure drops in cavity 32 simultaneously on the exterior and on the interior of the container. When carousel 12 reaches a predetermined angular position, it is considered that the level of vacuum on the exterior of the container has achieved a sufficient level and that the cam 88 and roller 86 system controls the closing of valve 82. It is then possible to continue the pumping exclusively on the inside of container 30.

Once the processing pressure has been reached, the processing can start. This processing may consist, for example, of depositing an internal coating. This deposit is obtained due to plasma ionization of a precursor gas injected into the container due to injector 62.

Once the processing has been completed, returning the cavity is advantageously returned to atmospheric pressure by using the internal tube 64 of the cover. There is a choice of doing this by connecting tube 74 to atmospheric pressure or choosing to equip tube 64 with a controlled opening (not shown) that makes it possible to connect directly to the atmosphere. In these two cases, care must be taken to actuate the opening of valve 82 so that the atmospheric pressure is re-established simultaneously on the exterior and on the interior of the container.

Once the pressure equilibrium is achieved between the exterior and the interior of the container, it is possible to actuate the cover towards its upper position, to remove the injector and to disconnect fork 54 downward with respect to cover 34 to make it possible to remove the processed container.

Thanks to the invention, the vacuum circuit of the machine can be designed in an economical and reliable manner since it does not use, at the level of the cover, flexible systems which would be stressed in a repetitive manner and which could thus break.

What is claimed is:

1. Device for processing a container using a low pressure plasma that is created by excitation of a gas due to electromagnetic waves, of the type having at least one processing station, comprising a fixed cavity, provided to hold the container to be processed, the cavity being intended to be connected to a vacuum source by way of a vacuum circuit of the type in which processing station has a mobile cover which makes it possible to close the cavity in a sealed manner and of the type in which the cover has means for supporting container such that the introduction of the container into the cavity before processing and its removal after processing are assured by displacement of the cover with respect to the cavity, characterized in that the cover has a connecting channel which, when the cover is in closed position places the cavity in connection with a fixed end of the vacuum circuit thus providing a vacuum in the cavity due to opening of said fixed end, and said fixed end closing upon placing the cover in opened position.

2. Device according to claim 1, characterized in that the connecting channel has one joining end which interacts with the fixed end of the vacuum circuit and two ends which open into the inner edge of cover which delimits the cavity when the cover is in closed position and in which support means are provided to place, in a sealed manner, an opening of the container to be processed against the interior edge of the cover, the opening completely surrounding a first of the ends in such a way that the container delimits, in the cavity, a first part connected to the vacuum circuit by the first end and a second part connected to the vacuum circuit by the second of the ends.

3. Device according to claim 2, characterized in that one of the two ends has a shutter controlled in order to be able to separate, in a sealed manner, the two parts of the cavity when cover is in closed position.

4. Device according to claim 3, characterized in that the shutter is a controlled valve.

5. Device according to any one of claims 2 to 4, characterized in that the first end of the connecting channel makes possible the passage of injector to bring a reagent gas into the interior of the container.

6. Device according to claim 1, characterized in that the connecting channel has an opening for return air which opens out to the open air and which is equipped with a controlled shutter in order to be able to connect the cavity to the atmosphere at the end of processing.

* * * * *